(12) United States Patent
Guo et al.

(10) Patent No.: US 11,216,393 B2
(45) Date of Patent: Jan. 4, 2022

(54) STORAGE DEVICE AND METHOD FOR MANUFACTURING THE SAME

(71) Applicant: LONTIUM SEMICONDUCTOR CORPORATION, Anhui (CN)

(72) Inventors: Xianghao Guo, Anhui (CN); Chuanxing Liu, Anhui (CN); Feng Chen, Anhui (CN); Hongfeng Xia, Anhui (CN); Jin Su, Anhui (CN); Haowei Guan, Anhui (CN); Diansheng Ren, Anhui (CN); Lianliang Tai, Anhui (CN); Dafeng Zhou, Anhui (CN); Guangren Li, Anhui (CN); Changqian Xie, Anhui (CN)

(73) Assignee: LONTIUM SEMICONDUCTOR CORPORATION, Anhui (CN)

( * ) Notice: Subject to any disclaimer, the term of this patent is extended or adjusted under 35 U.S.C. 154(b) by 0 days.

(21) Appl. No.: 15/930,227

(22) Filed: May 12, 2020

(65) Prior Publication Data

US 2021/0311886 A1    Oct. 7, 2021

(30) Foreign Application Priority Data

Apr. 2, 2020   (CN) .......................... 202010255430.3

(51) Int. Cl.
*G06F 13/16* (2006.01)
*H01L 21/768* (2006.01)
(Continued)

(52) U.S. Cl.
CPC .... *G06F 13/1668* (2013.01); *H01L 21/76898* (2013.01); *H01L 23/481* (2013.01); *H01L 27/10897* (2013.01)

(58) Field of Classification Search
None
See application file for complete search history.

(56) References Cited

U.S. PATENT DOCUMENTS

| 9,454,319 | B2 | 9/2016 | Stenfort |
| 10,109,344 | B2 | 10/2018 | Kang |
| (Continued) |

FOREIGN PATENT DOCUMENTS

| CN | 1365034 A | 8/2002 |
| CN | 101273380 A | 9/2008 |
| (Continued) |

OTHER PUBLICATIONS

Taiwanese Office Action regarding Application No. 109112525 dated Jan. 12, 2021. English translation provided by Unitalen Attorneys at Law.

(Continued)

*Primary Examiner* — Henry Tsai
*Assistant Examiner* — Christopher A Bartels
(74) *Attorney, Agent, or Firm* — Harness, Dickey & Pierce, P.L.C.

(57) ABSTRACT

A conversion apparatus, a storage device and a method for manufacturing the same are provided. The storage device may include a DDR storage layer, a DDR interface layer, a conversion logic circuit layer, and a peripheral interface layer. The peripheral interface layer may include a GDDR interface layer or a PCIe interface layer. The conversion logic circuit layer may process, by using DDR storage logic, data obtained through the peripheral interface layer and transfer processed data to the DDR interface layer, or process, by using GDDR storage logic, data obtained through the DDR interface layer and transfer processed data to the peripheral interface Layer. The DDR storage layer may be connected to the DDR interface layer, so that the conversion logic circuit layer can convert the storage logic of the data from DDR to GDDR or from GDDR to DDR.

10 Claims, 1 Drawing Sheet

(51) Int. Cl.
*H01L 23/48* (2006.01)
*H01L 27/108* (2006.01)

(56) References Cited

U.S. PATENT DOCUMENTS

| | | |
|---|---|---|
| 10,162,522 B1 | 12/2018 | Li et al. |
| 10,425,260 B2 | 9/2019 | Hollis et al. |
| 10,466,912 B2* | 11/2019 | Chen ............... G06F 3/0619 |
| 10,608,640 B1* | 3/2020 | Orthner ............ H03K 19/17796 |
| 10,686,634 B2 | 6/2020 | Hollis et al. |
| 10,707,875 B1* | 7/2020 | Orthner ............ H03K 19/17744 |
| 2007/0041121 A1 | 2/2007 | Neumann |
| 2007/0076008 A1 | 4/2007 | Osborne |
| 2007/0266179 A1* | 11/2007 | Chavan ............... G06F 13/4022 709/250 |
| 2010/0070696 A1 | 3/2010 | Blankenship |
| 2011/0242427 A1 | 10/2011 | Ramsdale |
| 2012/0131253 A1* | 5/2012 | McKnight ............ G06F 1/30 710/308 |
| 2014/0115596 A1* | 4/2014 | Khan ............... G06F 9/5011 718/104 |
| 2015/0106560 A1* | 4/2015 | Perego ............... G06F 12/0246 711/105 |
| 2015/0243259 A1 | 8/2015 | Hsu et al. |
| 2015/0339570 A1* | 11/2015 | Scheffler ............... G06N 3/04 706/16 |
| 2016/0018999 A1 | 1/2016 | Stenfort |
| 2016/0378704 A1* | 12/2016 | Adamson ............... G06F 13/385 710/104 |
| 2017/0194045 A1 | 7/2017 | Kang |
| 2019/0034097 A1 | 1/2019 | Chang et al. |
| 2019/0042131 A1* | 2/2019 | Pappu ............... G06F 13/4282 |
| 2019/0044764 A1 | 2/2019 | Hollis et al. |
| 2019/0107956 A1* | 4/2019 | Kachare ............... G06F 3/0688 |
| 2019/0164594 A1* | 5/2019 | Eom ............... G11C 29/028 |
| 2019/0228545 A1 | 7/2019 | Gan et al. |
| 2019/0306005 A1 | 10/2019 | Desai et al. |
| 2020/0012595 A1* | 1/2020 | Bordia ............... G06F 12/0238 |
| 2020/0028720 A1 | 1/2020 | Hollis et al. |
| 2020/0103894 A1* | 4/2020 | Celia ............... G06N 3/088 |
| 2020/0159436 A1 | 5/2020 | Walker et al. |
| 2020/0267032 A1 | 8/2020 | Hollis et al. |
| 2020/0356514 A1* | 11/2020 | Orthner ............... G06F 13/4068 |
| 2020/0356522 A1* | 11/2020 | Orthner ............... G06F 15/7892 |

FOREIGN PATENT DOCUMENTS

| | | |
|---|---|---|
| CN | 102215401 A | 10/2011 |
| CN | 102449610 A | 5/2012 |
| CN | 107068176 A | 8/2017 |
| CN | 110870013 A | 3/2020 |
| CN | 111198654 A | 5/2020 |
| WO | WO-2018038883 A1 | 3/2018 |

OTHER PUBLICATIONS

Korean Office Action regarding Application No. 10-2020-0052385 dated Mar. 15, 2021. English translation provided by Unitalen Attorneys at Law.

First Chinese Office Action regarding Application No. 2020102554303 dated Apr. 22, 2021. English translation provided by Unitalen Attorneys at Law.

* cited by examiner

STORAGE DEVICE AND METHOD FOR MANUFACTURING THE SAME

This application claims the priority to Chinese Patent Application No. 202010255430.3, titled "STORAGE DEVICE AND METHOD FOR MANUFACTURING THE SAME", filed on Apr. 2, 2020 with the China National Intellectual Property Administration, which is incorporated herein by reference in its entirety.

FIELD

The present disclosure relates to the technical field of semiconductor devices and manufacture of semiconductor devices, and particularly, to a storage device and a method for manufacturing the storage device.

BACKGROUND

Currently, graphics double data rate (GDDR) dynamic random access memory (DRAM) is a specific type of double data rate DRAM adapted to a graphics system having a high-bandwidth requirement. The GDDR DRAM is gradually upgraded from a first version (GDDR1) to a sixth version (GDDR6), with a higher bandwidth than the same generation of double data rate (DDR) DRAM. However, the GDDR DRAM has high design complexity and high cost.

SUMMARY

In view of this, an object of the present disclosure is to provide a storage device and a method for manufacturing the storage device, which reduce a cost of the storage device and improve a performance of the storage device.

In order to achieve the above object, the present disclosure provides the following technical solutions.

A conversion apparatus is provided according to an embodiment of the present disclosure, which includes: a double data rate (DDR) interface layer, a conversion logic circuit layer, and a peripheral interface layer. The peripheral interface layer includes a graphics double data rate (GDDR) interface layer or a peripheral component interconnect express (PCIe) interface layer.

The conversion logic circuit layer is configured to process, by using DDR storage logic, data obtained through the peripheral interface layer and transfer processed data to the DDR interface layer, and/or process, by using GDDR storage logic, data obtained through the DDR interface layer and transfer processed data to the peripheral interface layer.

In an embodiment, the conversion apparatus further includes a memory buffer. The memory buffer is connected to the DDR interface layer, the conversion logic circuit layer and the peripheral interface layer, and is configured to buffer data obtained through the peripheral interface layer, and/or buffer data obtained through the DDR interface layer.

A storage device is provided according to an embodiment of the present disclosure, which includes: a DDR storage layer and the above conversion apparatus. The DDR storage layer is connected to the DDR interface layer.

In an embodiment, the peripheral interface layer includes multiple channels, a capacity of the DDR storage layer connected to the channels is determined according to widths of the channels, and the number of channels of the DDR interface layer is determined based on the number of the channels of the peripheral interface layer and/or a capacity of the DDR interface layer.

In an embodiment, the DDR storage layer is integrated by using a through silicon vias TSV process.

In an embodiment, the DDR storage layer and the conversion apparatus are packaged by using a multi-chip package MCP process or a high bandwidth memory HBM process.

A method for manufacturing a storage device is provided according to an embodiment of the present disclosure, which includes: providing a double data rate DDR storage layer; and connecting the DDR storage layer to a conversion apparatus. The DDR storage layer is connected to a DDR interface layer in the conversion apparatus.

The conversion apparatus includes: the DDR interface layer, a conversion logic circuit layer, and a peripheral interface layer. The peripheral interface layer includes a GDDR interface layer or a PCIe interface layer. The conversion logic circuit layer is configured to process, by using DDR storage logic, data obtained through the peripheral interface layer and transfer processed data to the DDR interface layer, and/or process, by using GDDR storage logic, data obtained through the DDR interface layer and transfer processed data to the peripheral interface layer.

In an embodiment, the peripheral interface layer includes multiple channels, a capacity of the DDR storage layer connected to the channels is determined according to widths of the channels, and the number of channels of the DDR interface layer is determined based on the number of the channels of the peripheral interface layer and/or a capacity of the DDR interface layer.

In an embodiment, the DDR storage layer is integrated by using a through silicon vias TSV process.

In an embodiment, the connecting the DDR storage layer to the conversion apparatus includes packaging the DDR storage layer and the conversion apparatus by using a multi-chip package MCP process or a high bandwidth memory HBM process, to connect the DDR storage layer to the conversion apparatus.

The storage device and the method for manufacturing the storage device are provided according to the present disclosure. The storage device may include the DDR storage layer, the DDR interface layer, the conversion logic circuit layer, and the peripheral interface layer. The peripheral interface layer may include the GDDR interface layer or the PCIe interface layer. The conversion logic circuit layer may process, by using the DDR storage logic, data obtained through the peripheral interface layer and transfer processed data to the DDR interface layer, or process, by using the GDDR storage logic, data obtained through the DDR interface layer and transfer processed data to the peripheral interface layer. The DDR storage layer may be connected to the DDR interface layer, so that the conversion logic circuit layer can convert the storage logic of the data from DDR to GDDR or from GDDR to DDR. Data of the DDR storage layer may be outputted from the peripheral interface layer through the conversion logic circuit layer. Data inputted from the peripheral interface layer may be stored in the DDR storage layer through the conversion logic circuit layer, so that the function of GDDR can be realized based on the lower cost DDR in the storage device, thereby reducing the cost of the storage device.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION

Figure 1:
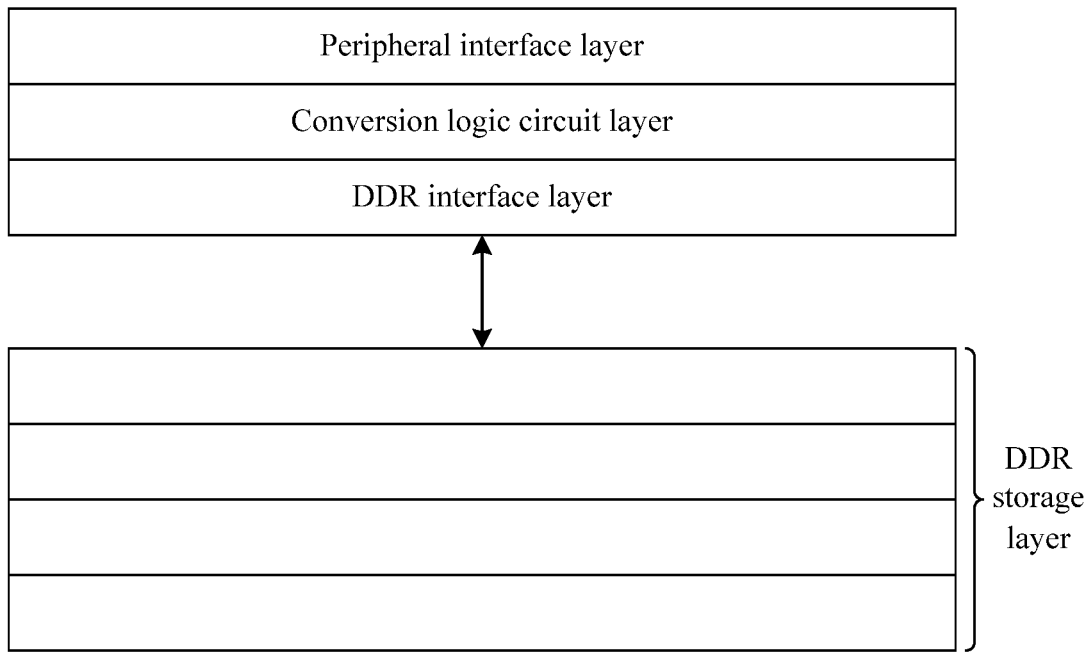
FIG. 1 is a structural schematic diagram of a storage device according to an embodiment of the present disclosure.

To make the above object, features and advantages of the present disclosure more apparent and easier to be understood, embodiments of the disclosure are illustrated in detail in conjunction with the drawings hereinafter.

Specific details are described in the following description so that the present disclosure can be understood completely. However, the present disclosure may also be embodied in other ways, a similar extension can be made by those skilled in the art without departing from intension of the present disclosure. Therefore, the present disclosure is not limited to the specific embodiments described below.

In addition, the present disclosure is described in detail in conjunction with drawings. When describing the embodiments of the present disclosure, for convenience of explanation, the cross-sectional view showing the structure of the device will not be partially enlarged according to the general scale, and the schematic diagram is only an example, which should not be used to limit the scope of protection of the present disclosure. In addition, the actual production should include three-dimensional dimensions of length, width and depth.

As described in BACKGROUND, a GDDR DRAM has a higher bandwidth, but has a greater delay. Therefore, GDDR DRAM is suitable for transmission of a large amount of data which is less sensitive to delay, such as images. In addition, GDDR DRAM has a more complex structure, higher power consumption and higher cost. With the popularity of graphics processing (such as general-purpose display systems, artificial intelligence, and AR/VR systems) and the increase in resolution, demand for high-speed GDDR chips is also increasing. Especially as video resolution is increased from 4K to 8K or even higher, the demand for high-speed GDDR chips increases exponentially.

How to provide a GDDR DDRAM having a higher bandwidth, lower complexity and lower cost at lower cost without an increased delay is an important issue in the art.

To solve the above technical issue, a storage device and a method for manufacturing the storage device are provided according to the embodiments of the present disclosure. The storage device may include a DDR storage layer, a DDR interface layer, a conversion logic circuit layer, and a peripheral interface layer. The peripheral interface layer may include a GDDR interface layer or a PCIe interface layer. The conversion logic circuit layer may process, by using the DDR storage logic, data obtained through the peripheral interface layer and transfer processed data to the DDR interface layer, or process, by using the GDDR storage logic, data obtained through the DDR interface layer and transfer processed data to the peripheral interface layer. The DDR storage layer may be connected to the DDR interface layer, so that the conversion logic circuit layer can convert the storage logic of the data from DDR to GDDR or from GDDR to DDR. Data of the DDR storage layer may be outputted from the peripheral interface layer through the conversion logic circuit layer. Data inputted from the peripheral interface layer may be stored in the DDR storage layer through the conversion logic circuit layer, so that the function of GDDR can be realized based on the DDR in the storage device. Compared with a GDDR storage layer, the DDR storage layer has lower complexity, lower cost, and a lower delay, and the peripheral interface layer has higher bandwidth, so that the storage device has characteristics of low complexity, low cost, low latency, and a high bandwidth.

In order to better understand the technical solutions and technical effects of the present disclosure, specific embodiments will be described in detail below with reference to the drawings.

Reference is made to FIG. 1, which is a schematic structural diagram of a storage device according to an embodiment of the present disclosure. The storage device may include a DDR storage layer and a conversion apparatus. The conversion apparatus may include a DDR interface layer, a conversion logic circuit layer, and a peripheral interface layer.

In an embodiment of the present disclosure, the DDR storage layer may be a wafer or a die provided with a DDR storage device. Multiple storage devices may be provided on each wafer or die. The wafer may be a bonded wafer in which multiple storage wafers are bonded together. Different storage wafers are connected with each other by using a through silicon via (TSV) process to achieve a greater storage capacity. The DDR storage device may be a general DDR storage device, such as a DDR2/DDR3/DDR4/DDR5. In actual operation, these storage devices can be used for data storage and buffering in general computer systems such as PC/Server. These storage devices have advantages of a wide bandwidth, a low delay, and moderate power consumption. However, although the DDR storage devices have a great advantage over the GDDR storage devices in terms of delay, the DDR storage devices have inferior speed and bandwidth when compared with GDDR storage devices. Therefore, the DDR storage devices are suitable for occasions such as random reading of data by a CPU.

The DDR interface layer may include two parts: a memory controller (MC) and a physical layer interface (PHY). There may be one or more DDR interface layers, each DDR interface may include one or more channels. Each channel may have a width of 64 bits, and may be used for read operations or write operations.

The DDR interface layer is connected to the DDR storage layer. The DDR storage layer may store data obtained through the DDR interface layer, and may use the DDR interface layer to transfer the stored data to an external device. The number of channels of the DDR interface layer may be determined based on a capacity of the DDR storage layer. A greater capacity of the DDR storage layer corresponds to a greater number of channels of the DDR interface layer.

The DDR interface layer and the DDR storage layer may be provided on the same wafer or on different wafers which are bonded with each other, so that the DDR interface lay may be connected to the DDR storage layer by using a TSV process. Of course, the DDR interface layer and the DDR storage layer may be set on different dies, and may be connected with each other by using a multi-chip package (MCP) process or a high bandwidth memory (HBM) process.

The conversion logic circuit layer functions to convert storage logic. In an embodiment, data of DDR storage logic may be converted into data of GDDR storage logic, and/or data of GDDR storage logic may be converted into data of DDR storage logic. Therefore, the conversion logic circuit layer may be connected to the DDR interface layer and the peripheral interface layer, respectively, so that data of the DDR storage logic obtained through the DDR interface layer may be converted into data of the GDDR storage logic, and data of the GDDR storage logic obtained through the peripheral interface layer may be converted into data of the DDR storage logic. The conversion logic circuit layer is designed based on characteristics of the GDDR storage logic and the DDR storage logic, so as to realize mutual conversion of the GDDR storage logic and the DDR storage logic.

The peripheral interface layer is an interface that may be connected to an external circuit, such as a CPU or a graphics system. The external circuit may read data from the DDR storage layer through the peripheral interface layer, the conversion logic circuit layer, and the DDR interface layer, and may store data into the DDR storage layer through the peripheral interface layer, the conversion logic circuit layer, and the DDR interface layer. The peripheral interface layer may be a GDDR interface layer or a PCIe interface layer. In this way, the peripheral interface layer may be connected to the graphics system or a PCIe bus to transmit data confirming a GDDR storage standard.

The peripheral interface layer may have multiple channels, and each channel may be used for read operations or write operations. The number of channels may be determined based on a data transmission rate. In an embodiment of the present disclosure, the number of channels of the DDR interface layer may be determined based on the number of channels of the peripheral interface layer, such that the transmission rate and the bandwidth of the DDR storage layer matches the transmission rate and the bandwidth of the peripheral interface layer.

A conversion logic circuit layer and the peripheral interface layer may be provided on different layers of the same wafer, or on different wafers bonded together, or may be provided on different dies and connected with each other by using the MCP process, to obtain the conversion apparatus with a smaller size. For example, the conversion apparatus may be provided on different layers of the same wafer, and vertical vias between the different layers may be used to implement a connection among the different layers. Alternatively, the conversion apparatus may be provided on different wafers bonded together, and connection among different wafers may be implemented by using the TSV process.

The conversion apparatus may be integrated with the DDR storage layer by using, for example, the MCP process or the HBM process, so that there is no need to temporarily connect the conversion apparatus with the DDR storage layer, and there is no need to provide connection pins for the conversion apparatus and the DDR storage layer, thereby further reducing the device size. The storage device may be obtained by integrating the conversion apparatus and the DDR storage layer together. The storage device includes the DDR storage layer, the conversion logic circuit layer, and the peripheral interface layer, to implement the function of the GDDR storage. Due to the lower cost and lower complexity of the DDR storage layer, the overall complexity and cost of the storage device are reduced. In addition, the peripheral interface layer is the GDDR interface layer or the PCIe interface layer, which may provide lower bandwidth.

It should be noted that performance of the DDR storage layer is weaker than that of the GDDR. To compensate for this, more DDR storage layers that operate in parallel may be provided. In fact, the peripheral interface layer may include multiple channels, and each channel may have a great width, to achieve a greater bandwidth. Therefore, the DDR storage layer corresponding to each channel of the peripheral interface layer may be configured according to the width of the channel of the peripheral interface layer to utilize multiple storage cells with lower storage performance to adapt to higher bandwidth. For example, a capacity of the DDR storage layer corresponding to each channel of the peripheral interface layer is consistent with the width of the channel. Of course, even if a greater number of DDR storage layers are provided, the complexity and cost of the storage device are reduced.

In an embodiment of the present disclosure, the conversion apparatus further includes a memory buffer, which is connected to the DDR interface layer, the peripheral interface layer, and the conversion logic circuit, for buffering the data obtained through the peripheral interface layer, and/or the data obtained through the DDR interface layer, so that data obtaining and data conversion may be performed in parallel, thereby further improving an efficiency of data conversion, increasing a speed of the conversion apparatus, including a speed of the storage device of the conversion apparatus.

The memory buffer may be connected to the DDR interface layer, the peripheral interface layer, and the conversion logic circuit by using the TSV process, the MCP process, or the HBM process, which is not described here. In a HBM interface, the DDR interface layer is connected to different DDR storage layers (dies) through respective independent channels. The channels are unrelated to each other, so that timing of each channel may be independently configured to increase the data transmission rate. For example, in a case that each chip includes four die stacks, each die has two channels, and each channel has a width of 128 bits, four chips may provide a total data bit width of 4 (Stacks)*4 (Dies)*2 (Channels)*128 (bits), i.e., 4096 bit.

The storage device is provided according to the present disclosure. The storage device may include the DDR storage layer, the DDR interface layer, the conversion logic circuit layer, and the peripheral interface layer. The peripheral interface layer may include the GDDR interface layer or the PCIe interface layer. The conversion logic circuit layer may process, by using the DDR storage logic, data obtained through the peripheral interface layer and transfer processed data to the DDR interface layer, or process, by using the GDDR storage logic, data obtained through the DDR interface layer and transfer processed data to the peripheral interface layer. The DDR storage layer may be connected to the DDR interface layer, so that the conversion logic circuit layer can convert the storage logic of the data from DDR to GDDR or from GDDR to DDR. Data of the DDR storage layer may be outputted from the peripheral interface layer through the conversion logic circuit layer. Data inputted from the peripheral interface layer may be stored in the DDR storage layer through the conversion logic circuit layer, so that the function of GDDR can be realized based on the lower cost DDR in the storage device, thereby reducing the cost of the storage device.

Figure 2:
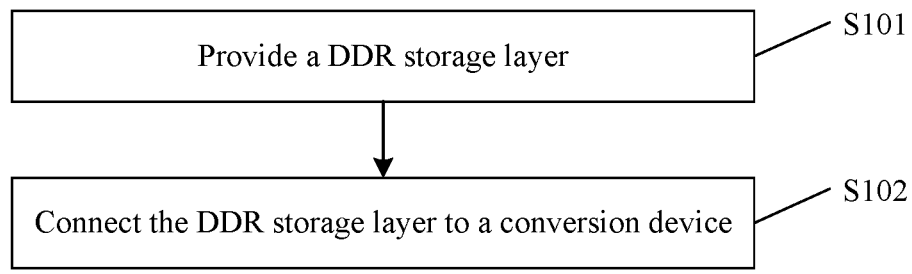
FIG. 2 is a flow chart of a method for manufacturing a storage device according to an embodiment of the present disclosure.

Based on the storage device according to the above embodiments, a method for manufacturing the storage device is further provided according to an embodiment of the present disclosure. Referring to FIG. 2, the method may include the following steps S101 to S102.

In step S101, a DDR storage layer is provided.

In an embodiment of the present disclosure, the DDR storage layer may be a wafer or a die provided with a DDR storage device. Multiple storage devices may be provided on each wafer or die. The wafer may be a bonded wafer in which multiple storage wafers are bonded together. Different storage wafers are connected with each other by using a through silicon via (TSV) process to achieve a greater storage capacity. The DDR storage device may be a general DDR storage device, such as a DDR2/DDR3/DDR4/DDR5. In actual operation, these storage devices can be used for data storage and buffering in general computer systems such as PC/Server. These storage devices have advantages of a wide bandwidth, a low delay, and moderate power consumption. However, although the DDR storage devices have a great advantage over the GDDR storage devices in terms of delay, the DDR storage devices have inferior speed and bandwidth when compared with GDDR storage devices. Therefore, the DDR storage devices are suitable for occasions such as random reading of data by a CPU.

In step S102, the DDR storage layer is connected to a conversion apparatus.

The conversion apparatus may include: a DDR interface layer, a conversion logic circuit layer, and a peripheral interface layer.

The DDR interface layer is connected to the DDR storage layer. The DDR storage layer may store data obtained through the DDR interface layer, and may transfer stored data to an external device through the DDR interface layer.

The conversion logic circuit layer functions to convert storage logic. In an embodiment, data of DDR storage logic may be converted into data of GDDR storage logic, and/or data of GDDR storage logic may be converted into data of DDR storage logic.

The peripheral interface layer is an interface that may be connected to an external circuit, such as a CPU or a graphics system. The external circuit may read data from the DDR storage layer through the peripheral interface layer, the conversion logic circuit layer, and the DDR interface layer, and may store data into the DDR storage layer through the peripheral interface layer, the conversion logic circuit layer, and the DDR interface layer. The peripheral interface layer may be a GDDR interface layer or a PCIe interface layer. In this way, the peripheral interface layer may be connected to the graphics system or a PCIe bus to transmit data confirming a GDDR storage standard. The peripheral interface layer may include multiple channels.

The conversion apparatus may be integrated with the DDR storage layer by using, for example, the MCP process or the HBM process, so that there is no need to temporarily connect the conversion apparatus with the DDR storage layer, and there is no need to provide connection pins for the conversion apparatus and the DDR storage layer, thereby further reducing the device size.

It should be noted that performance of the DDR storage layer is weaker than that of the GDDR. To compensate for this, more DDR storage layers that operate in parallel may be provided. In fact, the peripheral interface layer may include multiple channels, and each channel may have a great width, to achieve a greater bandwidth. Therefore, the DDR storage layer corresponding to each channel of the peripheral interface layer may be configured according to the width of the channel of the peripheral interface layer to utilize multiple storage cells with lower storage performance to adapt to higher bandwidth. Of course, the number of channels of the DDR interface layer may further match the number of channels of the peripheral interface layer to achieve a great overall bandwidth of the memory device.

Embodiments in this specification are described in a progressive manner, each of the embodiments emphasizes differences between the embodiment and other embodiments, and the same or similar parts among the embodiments can be referred to each other. Since method embodiments are similar to storage device embodiments, the description thereof is relatively simple, and reference may be made to the description of the storage device embodiments for relevant parts.

The embodiments described hereinabove are only preferred embodiments of the present application. Although the present application is disclosed by the above preferred embodiments, the preferred embodiments should not be interpreted as a limitation to the present application. For those skilled in the art, many variations, modifications or equivalent replacements may be made to the technical solutions of the present application by using the methods and technical contents disclosed hereinabove, without departing from the scope of the technical solutions of the present application. Therefore, any simple modifications, equivalent replacements and modifications, made to the above embodiments based on the technical essences of the present application without departing from the technical solutions of the present application, are deemed to fall into the scope of the technical solution of the present application.

The invention claimed is:

1. A conversion apparatus, comprising: a double data rate DDR interface layer, a conversion logic circuit layer, and a peripheral interface layer, wherein
   the peripheral interface layer comprises a graphics double data rate GDDR interface layer or a peripheral component interconnect express PCIe interface layer, and is configured to be connected to an external circuit and transmit data confirming a GDDR storage standard;
   the DDR interface layer is connected to a double data rate DDR storage layer;
   the conversion logic circuit layer is configured to
   process, by using DDR storage logic, the data confirming the GDDR storage standard that is obtained through the peripheral interface layer, transfer processed data to the DDR interface layer, and store the processed data in the DDR storage layer, and/or process, by using GDDR storage logic, data that is stored in the DDR storage layer and obtained through the DDR interface layer and transfer processed data to the peripheral interface layer to output the data through the peripheral interface layer.

2. The conversion apparatus according to claim 1, further comprising a memory buffer, wherein
   the memory buffer is connected to the DDR interface layer, the conversion logic circuit layer and the peripheral interface layer, and is configured to buffer data obtained through the peripheral interface layer, and/or buffer data obtained through the DDR interface layer.

3. A storage device, comprising: a double data rate DDR storage layer and the conversion apparatus according to claim 1, wherein the DDR storage layer is connected to the DDR interface layer.

4. The storage device according to claim 3, wherein the peripheral interface layer comprises a plurality of channels, a capacity of the DDR storage layer connected to the channels is determined according to widths of the channels, and the number of channels of the DDR interface layer is determined based on the number of the channels of the peripheral interface layer and/or a capacity of the DDR interface layer.

5. The storage device according to claim 4, wherein the DDR storage layer is integrated by using a through silicon vias TSV process.

6. The storage device according to claim 3, wherein the DDR storage layer and the conversion apparatus are packaged by using a multi-chip package MCP process or a high bandwidth memory HBM process.

7. A method for manufacturing a storage device, comprising:

providing a double data rate DDR storage layer; and connecting the DDR storage layer to a conversion apparatus, wherein the DDR storage layer is connected to a DDR interface layer in the conversion apparatus, wherein the conversion apparatus comprises: the DDR interface layer, a conversion logic circuit layer, and a peripheral interface layer, the peripheral interface layer comprises a graphics double data rate GDDR interface layer or a peripheral component interconnect express PCIe interface layer, and is configured to transmit data confirming a GDDR storage standard, and the conversion logic circuit layer is configured to process, by using DDR storage logic, the data confirming the GDDR storage standard that is obtained through the peripheral interface layer, transfer processed data to the DDR interface layer, and store the processed data in the DDR storage layer, and/or process, by using GDDR storage logic, data that is stored in the DDR storage layer and obtained through the DDR interface layer and transfer processed data to the peripheral interface layer to output the data through the peripheral interface layer.

8. The method according to claim 7, wherein the peripheral interface layer comprises a plurality of channels, a capacity of the DDR storage layer connected to the channels is determined according to widths of the channels, and the number of channels of the DDR interface layer is determined based on the number of the channels of the peripheral interface layer and/or a capacity of the DDR interface layer.

9. The method according to claim 8, wherein the DDR storage layer is integrated by using a through silicon vias TSV process.

10. The method according to claim 7, wherein the connecting the DDR storage layer to the conversion apparatus comprises:

packaging the DDR storage layer and the conversion apparatus by using a multi-chip package MCP process or a high bandwidth memory HBM process, to connect the DDR storage layer to the conversion apparatus.

\* \* \* \* \*